US007247901B2

(12) United States Patent
Chou

(10) Patent No.: US 7,247,901 B2
(45) Date of Patent: Jul. 24, 2007

(54) METHOD FOR FORMING 1 TRAM CELL AND STRUCTURE FORMED THEREBY

(75) Inventor: Chung-Cheng Chou, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/827,389

(22) Filed: Apr. 19, 2004

(65) Prior Publication Data

US 2005/0230764 A1 Oct. 20, 2005

(51) Int. Cl.
*H01L 27/108* (2006.01)
(52) U.S. Cl. ....................... 257/296; 257/311
(58) Field of Classification Search ............... 257/296, 257/311
See application file for complete search history.

(56) References Cited

U.S. PATENT DOCUMENTS

| 2002/0163848 | A1  |   | 11/2002 | Grasso |
|---|---|---|---|---|
| 2003/0095427 | A1  |   | 5/2003 | Afghahi et al. |
| 2004/0043587 | A1 | * | 3/2004 | Lawlor ..................... 438/525 |

* cited by examiner

*Primary Examiner*—Long Pham
(74) *Attorney, Agent, or Firm*—Duane Morris LLP

(57) ABSTRACT

A single transistor random access memory cell has an MOS well, a transfer gate of the transistor and a storage capacitor having a storage node in the well that becomes an inversion layer at a threshold voltage near zero. The inversion layer diffuses to an inversion region beneath the transfer gate when the transfer gate is turned on. For high speed operation, a doped region beneath the transfer gate becomes an inversion layer at a threshold voltage near zero. In this invention, a storage node junction is removed, which removes junction leakage and reduces subthreshold leakage current significantly.

14 Claims, 4 Drawing Sheets

METHOD FOR FORMING 1 TRAM CELL AND STRUCTURE FORMED THEREBY

BACKGROUND

Field of the Invention

The present invention relates to a structure and method for semiconductor integrated circuits; more particularly, the present invention relates to a method for forming a one transistor random access memory cell, 1TRAM cell and the cell structure formed thereby.

In a dynamic random access memory, DRAM, and a conventional 1TRAM, a memory cell is fabricated with a selection transistor, or transfer gate, and a storage capacitor. The selection transistor is a switch, and the capacitor stores electric charges that represent data. For example, the terminal voltage of the capacitor determines the binary information stored therein. A high terminal voltage represents a binary value "1" and a low terminal voltage represents a binary value "0", or the opposite could be the case. A "write" operation is performed when a voltage corresponding to the binary information is applied to the memory cell. A "read" operation occurs when a sensing circuit compares the current from the capacitor and a reference current, and thereby provides a read signal indicative of either the existence or absence of a capacitor charge.

The DRAM and conventional 1TRAM are fabricated with a transfer gate and a storage capacitor of MOS construction, which has a storage node, also regarded as the bottom plate of the capacitor, formed by a junction type, source/drain, S/D implant and/or a junction type, LDD implant between the transfer gate and the storage capacitor. The DRAM and conventional 1TRAM have several disadvantages that adversely reduce the data retention time of data stored by the storage capacitor. The capacitor has a relatively small area. The subthreshold current for a junction is relatively high, as is the turn-on current for a junction, which fosters leakage current in multiple junction leakage paths from the storage node junction.

A DRAM and conventional 1TRAM have a further disadvantage because the transfer gate and capacitor plate are spaced apart poly structures requiring a minimum isolation, or minimum poly to poly spacing. The minimum isolation can be difficult to attain when the transfer gate and capacitor plate are fabricated by a one poly process step. Slight variations in the one poly process step may require a larger separation between the poly to poly structures than would be required by a minimum isolation, or minimum poly to poly spacing. Thus, a one poly process step places a limitation on a desired reduction of the cell size.

A drawback of a DRAM resides in the fact that since the information is stored in terms of an electrical charge of the memory cell capacitor, it is subjected to being lost, primarily due to the inevitable leakages of charges across the semiconductor junctions. Because of the charge leakage, it is necessary to perform a periodic refresh operation of the information stored in each memory cell with a prescribed time period, so as to restore the prescribed electrical charge of the capacitor.

FIG. 1 illustrates a cross-sectional configuration of a DRAM cell in accordance with a related art. The DRAM cell includes a substrate 100 having a shallow trench isolation (STI) structure 110 therein. A transfer gate 120 and an electrode plate or capacitor plate 130 are formed above the substrate 100. A well region 105 is formed within the substrate 100 under the electrode plate 130. Junction type, source/drain (S/D) regions 140 and 150 are formed within the substrate 100 and adjacent to the transfer gate 120 and the electrode plate 130, respectively.

As shown in FIG. 1, the substantially planar electrode plate 130 is formed over the STI structure 110. The S/D regions 140 and 150 usually have high dopant concentrations. The S/D region 150 also serves as a storage node junction storing charges to, or receiving charges from, the S/D region 140 when the transistor controlled by the transfer gate 120 is turned on. The S/D region 150 has some drawbacks. First, due to the high dopant concentration of the S/D region 140 and 150, dopants within the S/D region 150 may diffuse into the channel region beneath the transfer gate 120. The dopant diffusion creates short channel effect and generates a subthreshold leakage current between the S/D regions 140 and 150. Another issue is the junction leakage current generated from the junction between the S/D region 150 and the well region 105 within the substrate 100. The subthreshold leakage current and the junction leakage account for about 80% of the total leakage current. Therefore, the charges stored in a storage node junction of the capacitor are prone to discharge. The ease of charge loss needs to be compensated by increasing the frequency of self refresh of the DRAM cells.

U.S. Pat. Application No. 2003/0095427, titled "Reduced leakage memory cell," disclosed a random access memory cell. The cell comprises a first conductor line, a second conductor line, a native device arranged to store charge and a high voltage threshold transistor coupling the native device to the first conductor and the second conductor.

SUMMARY

The 1TRAM of the present invention extends the data retention time and reduces the cell size as compared with that of a DRAM and conventional 1TRAM. The invention omits a junction type storage node.

The 1TRAM is an independent memory cell that differs from a conventional DRAM. First, the 1TRAM cell size is larger than that of a DRAM, with a capacitance of only a few femto-Farads, as compared with a DRAM capacitance in the order of tens~hundreds of femto-Farads. Second, total logic processing of the 1TRAM readily integrates or combines the 1TRAM with logic circuits for SoC applications.

According to an embodiment of the present invention, a 1TRAM cell has a storage capacitor with a native device. According to a further embodiment of the present invention, a 1TRAM cell has a storage capacitor and a transfer gate, each with a native device.

According to another embodiment of the invention, a junction type storage node is replaced with an MOS native device with a low threshold voltage, very shallow, or near zero, which consequently becomes an inversion region or inversion layer at low operation voltage.

Another embodiment of the invention includes a storage capacitor with a storage node having a native device of low ion concentration MOS dopant in an MOS well, which capacitor turns on or enters inversion region operation without having a P/N storage node junction that would contribute to junction leakage.

According to another embodiment of the present invention, the 1TRAM of the present invention has a transfer gate and a capacitor plate, respectively, formed by two separate poly processes. The two poly processes self-align the two poly structures with precision to have adequate isolation, even with reduced poly to poly spacing, which is advantageous for a reduced cell size.

According to another embodiment of the present invention, a 1TRAM cell has a storage capacitor with an insulator of an etched STI having a reduced step height below that of an OD sidewall of a substrate insulator to increase the capacitance.

A 1TRAM cell is disclosed, which includes a substrate having an isolation region partially filled with an isolation material therein. A transfer gate adjacent to an electrode plate or capacitor plate is formed above the substrate wherein the electrode plate is overlapping the isolation region. A source/drain (S/D) region is formed within the substrate and adjacent to the transfer gate. A doped region is formed within the substrate and beneath the electrode plate for forming a native device.

A method for forming a 1TRAM cell is also disclosed. The method includes the steps of: forming an isolation region partially filled with an isolation material within a substrate; forming a transfer gate and an electrode plate, or capacitor plate, above the substrate, the electrode plate overlapping the isolation region; forming a source/drain (S/D) region within the substrate and adjacent to the transfer gate; and forming a doped region within the substrate and beneath the electrode plate for forming a native device.

DETAILED DESCRIPTION

Figure 2A:
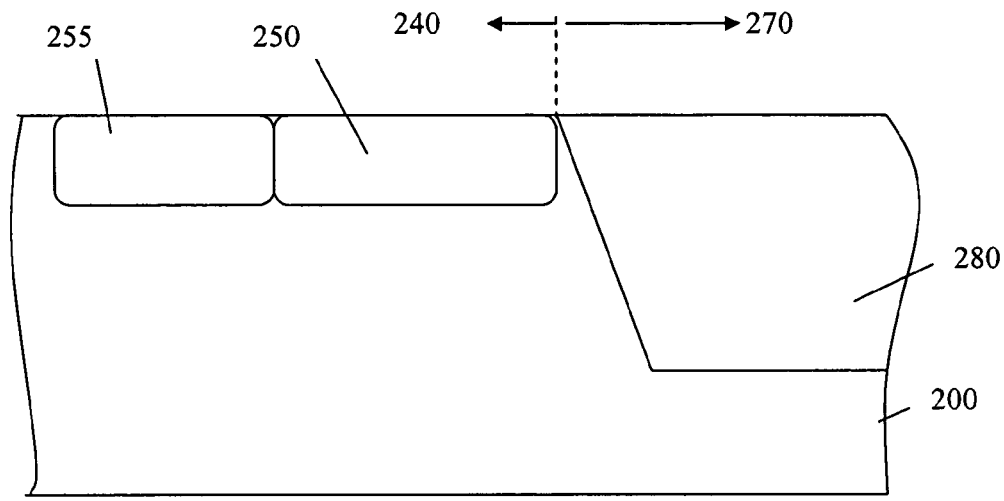
FIGS. 2A-2C are schematic cross-sectional configurations showing an exemplary method of forming a 1TRAM cell and a 1TRAM cell structure formed thereby in accordance with the present invention.

FIG. 2A is a schematic cross-sectional configuration showing an isolation material 280, a first doped region 250 relative to a storage capacitor, and a dopant diffusion region 255 relative to a transfer gate, respectively, within a substrate 200 of an MOS well in an active region 240. Region 250 and region 255 have the same doping profile, or alternatively, have different doping profiles. The region 250 and the region 255 have the same dielectric thickness, or alternatively, have different dielectric thicknesses. The substrate 200 has an active region 240 lengthwise of an isolation region 270.

The substrate 200 is adapted to form integrated circuits thereon. Substrate 200 may include, for example, a silicon substrate, silicon-germanium substrate, silicon-on-insulator (SOI) substrate, III-V compound substrate, or any other substrate that can substantially perform the same function of the substrate 200.

The isolation region 270 may be an STI region formed by a shallow trench isolation (STI) process, local oxidation (LOCOS) process, or the like. The well of the substrate 200 is bounded by the isolation region 270. In the embodiment shown in FIG. 2A, the isolation material 280 is formed within the substrate 200 by a STI process, which includes the steps of, for example, forming a pad oxide layer (not shown) over the substrate 200 and a pad nitride layer (not shown) over the pad oxide layer; forming an opening through the pad oxide, pad nitride, and within the substrate 200 thereby forming a mesa therein; and forming the isolation material 280 within the opening. Therefore, the isolation material 280 is formed within the isolation region 270. In some embodiments, a chemical mechanical polish (CMP) process or an etch-back process is performed to remove a portion of the isolation material 270 above the surface of the pad nitride layer (not shown). The isolation material 280 is, for example, oxide, nitride, oxynitride or any other material that can serve as the isolation material 280, and be formed, for example, by a chemical vapor deposition (CVD) process. In the embodiment shown in FIG. 2A, the isolation material 280 is an oxide layer and formed by a high density plasma (HDP) deposition process.

The first doped region 250 within the substrate 200 serves as a bottom electrode of a capacitor and determines the turn-on voltage thereof. The MOS dopant of the doped region 250 is a P-type dopant, such as boron or gallium, for N-type metal-oxide-semiconductor (NMOS) transistors, or a N-type dopant, such as phosphorous or arsenic, for P-type metal-oxide-semiconductor (PMOS) transistors. In some embodiments wherein a N-type dopant is used, the occurrence of hot carrier effects is substantially reduced in the doped region 250. The invention may omit a storage node junction. According to an alternative embodiment of the invention, a storage node junction may be replaced by a charge coupling mechanism between two adjacent native devices, an MOS region 250 with a threshold voltage, very shallow or near zero, and an adjacent native device region 255 with a threshold voltage, very shallow or near zero, and consequently, a substantially reduced, low subthreshold voltage, and with ease in becoming an inversion region in operation. An embodiment of the native device has a low concentration MOS dopant in an MOS well of a storage capacitor, which turns on or enters inversion region operation without having a node formed by a storage node junction, for example, a P/N junction, that would contribute to junction leakage.

In some embodiments, the first doped region 250, and/or the alternative adjacent region 255, is formed by a well-implantation process or the other implantation process specifically used to adjust the dopant concentration. In the embodiment shown in FIG. 2A, the first doped region 250, and/or the alternative adjacent region 255, is an N-type doped region and formed by a well implantation process step.

Figure 2B:
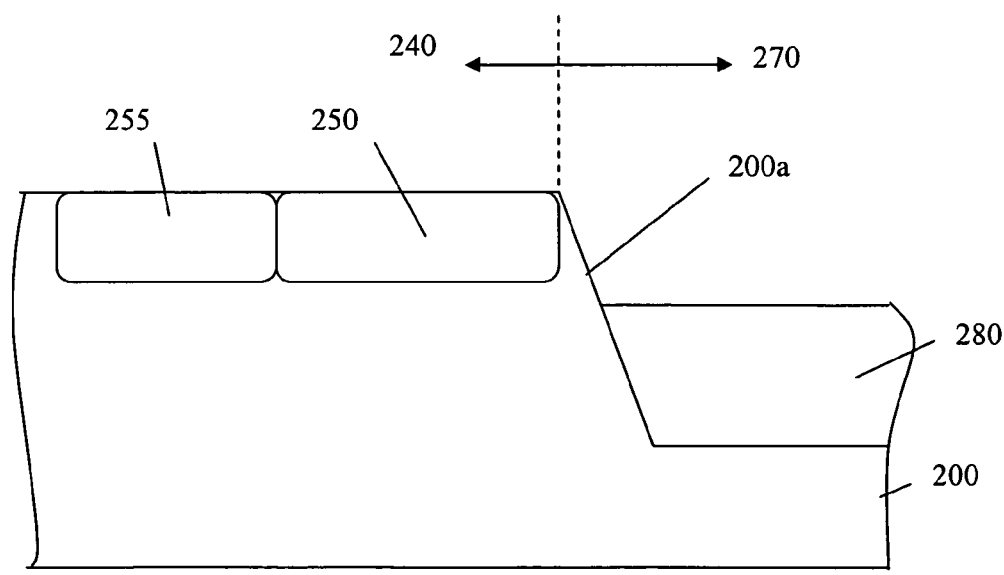

FIG. 2B is a cross-sectional configuration showing the structure of FIG. 2A after a portion of the isolation material 280 is removed. The removal of the isolation material 280 may be performed, for example, by a dry plasma etch using chemistries such as, $CF_4$, $CHF_3$, $C_2F_6$, $C_3F_8$, $C_4F_8$ or a mixture thereof, as an etch reaction gas. The remaining thickness of the isolation material 280 depends on the isolation performance of the isolation region 270. In the embodiment shown in FIG. 2B, the remaining isolation material 280 is formed at the bottom of the mesa structure. In this embodiment, the thickness of the remaining isolation material 280 is from about 1500Å to about 2500Å when the depth of the trench or mesa is from about 3000Å to about 5000Å. The isolation material 280 is etched to create a reduced step height relative to a surrounding OD sidewall 200a of the substrate 200.

Figure 2C:
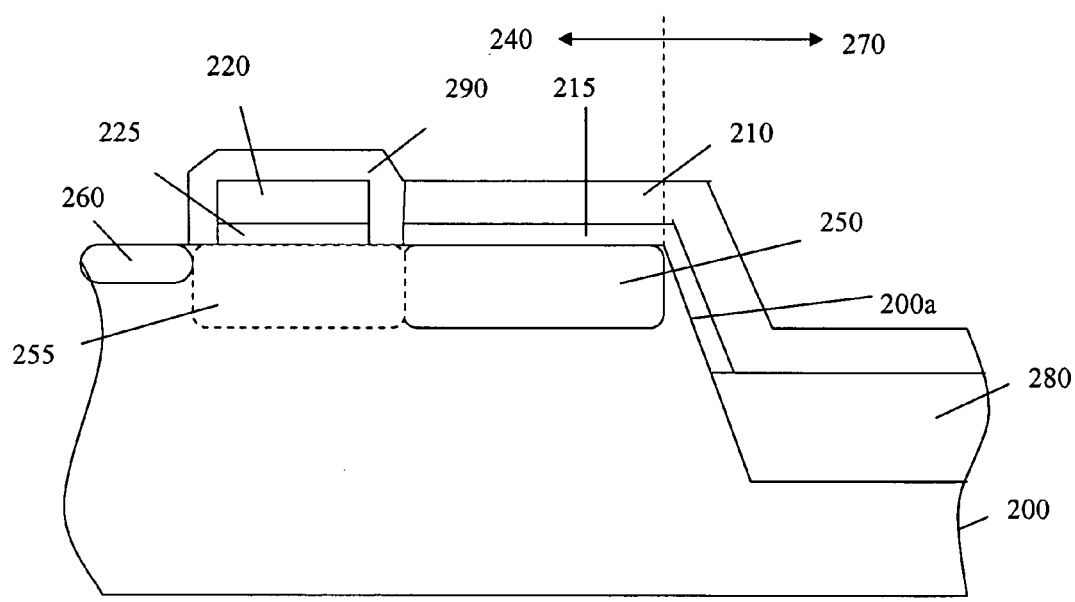

FIG. 2C is a cross-sectional configuration showing a structure after a transfer gate 220, a gate dielectric layer 225, an electrode plate or capacitor plate 210 and a capacitor dielectric 215 are formed above the substrate 200; a dielectric layer 290 is formed over the transfer gate 220 and between the transfer gate 220 and the electrode plate 210; and a doped region 260 is formed within the substrate 200.

The gate dielectric layer 225 and the capacitor dielectric layer 215 serve to isolate the transfer gate 220 and the electrode plate 210 from the substrate 200, and couple the voltages applied to the transfer gate 220 and the electrode plate 210 to the substrate 200. The gate dielectric layer 225 and the capacitor dielectric layer 215 is referred to as a poly that includes, and is not limited to: silicon oxide, silicon oxynitride, silicon nitride, high dielectric constant material, or any other material that can serve as the gate dielectric layer 225 and the capacitor dielectric layer 215. For example the poly may be formed by CVD or PVD. The transfer gate 220 is adapted to control the transistor formed thereby. The electrode plate 210 is adapted to control the capacitor formed thereby. The transfer gate 220 and the electrode plate 210 are, for example, polysilicon, WSi, metal or the like, and formed by, for example, chemical vapor deposition (CVD) or physical vapor deposition (PVD) processes. There is no requirement that the gate dielectric layer 225 and the capacitor dielectric layer 215, or the transfer gate 220 and the electrode plate 210 be formed of the same material.

In the embodiment shown in FIG. 2C, the transfer gate 220 and the electrode plate 210 are formed in different processes. Therefore, a design rule requirement that a space exist between the transfer gate 200 and the electrode plate 210 on a photomask is removed.

The dielectric layer 290 is formed to isolate the transfer gate 220 from the electrode plate 210. The dielectric layer 290 is, for example, silicon oxide, silicon oxynitride, silicon nitride or any other dielectric material that can serve as the dielectric layer 290 and may be formed by, for example, a CVD or PVD process. In the embodiment shown in FIG. 2C, the dielectric layer 290 is formed by a spacer formation process. In this embodiment, the dielectric layer 290 has a thickness of from about 200Å to about 800Å.

In the embodiment shown in FIG. 2C, the source/drain (S/D) region 260 is formed within the substrate 200 and adjacent to the transfer gate 220. The S/D region 260 is a P-type or N-type doped region for a PMOS or NMOS transistor, respectively. In some embodiments wherein a P-type S/D region is formed within the substrate 200, a P-type dopant, such as boron or gallium, may be, for example, implanted into the substrate 200. In other embodiments wherein a N-type S/D region is formed, a N-type dopant, such as phosphorous or arsenic is used.

From FIG. 2C, the electrode plate 210 overlaps the isolation region 270 and is formed above the substrate 200 and within the recess of the STI 280 of the isolation region 270. The electrode plate 210 is the top electrode or plate of the capacitor. The overlap between the electrode plate 210 and the isolation region 270 increases the area of the capacitor because the electrode plate covers the OD sidewall 200a surrounding the STI 280 which has been etched to a lower step height than the sidewall 200a. The thinner the remaining isolation material 280 formed at the bottom of the isolation region 270, the more sidewall area of the recess of the isolation region 270 the electrode plate 210 covers. Therefore, the capacitance of the DRAM cell can increase. However, the thin remaining isolation material 280 will reduce the isolation performance of the isolation region 270. One of the ordinary skill in the art understands how thick the isolation material should be depends on the depth of the trench and the isolation performance of the isolation region 270, and perceive how to adjust the remaining thickness of the isolation material 280 within the isolation region 270. In some embodiments, the remaining thickness of the isolation material 280 is about half of the height of the trench.

As mentioned in FIG. 2A, the doped region 250 is, for example, formed by a well-implantation process or the other implantation process specifically used to adjust the dopant concentrations of the doped region 250. The first doped region 250 is formed within the substrate 200 and beneath the electrode plate 210. The dopant concentration of the first doped region 250 is to form a native device. A native device means a transistor which has a low threshold voltage, for example no more than 0.1V for NMOS transistors, or −0.1V for PMOS transistors. In some embodiments wherein a N-type dopant is used to form the first doped region 250, the first doped region 250 has a dopant concentration from about $5 \times 10^{17}/cm^3$ to about $1 \times 10^{19}/cm^3$.

The second doped region 255 is under the gate 220 and determines the turn on voltage thereof. During turn on, the region beneath the capacitor plate 210, which is regarded as the storage node of the 1TRAM memory cell, easily turns to the inversion mode at near zero threshold voltage, without a junction mode operation. And the inversion layer of the first doped region 250 diffuses into the region 255 beneath the transfer gate 220, which increases the coupling efficiency between the transfer gate 220 and the capacitor top plate 210 during data write-in or read-out.

In this embodiment, no junction type storage node is formed within the substrate 200 and between the transfer gate 220 and the electrode plate 210. Therefore, the junction leakage current is effectively reduced within the cell.

It is important to increase the speed of data access by enhancement of the coupling efficiency of data charge coupling between the transfer gate and the capacitor. The coupling efficiency is enhanced by reducing the distance between the transfer gate and the capacitor, and by eliminating a junction type S/D storage node.

Figure 1:
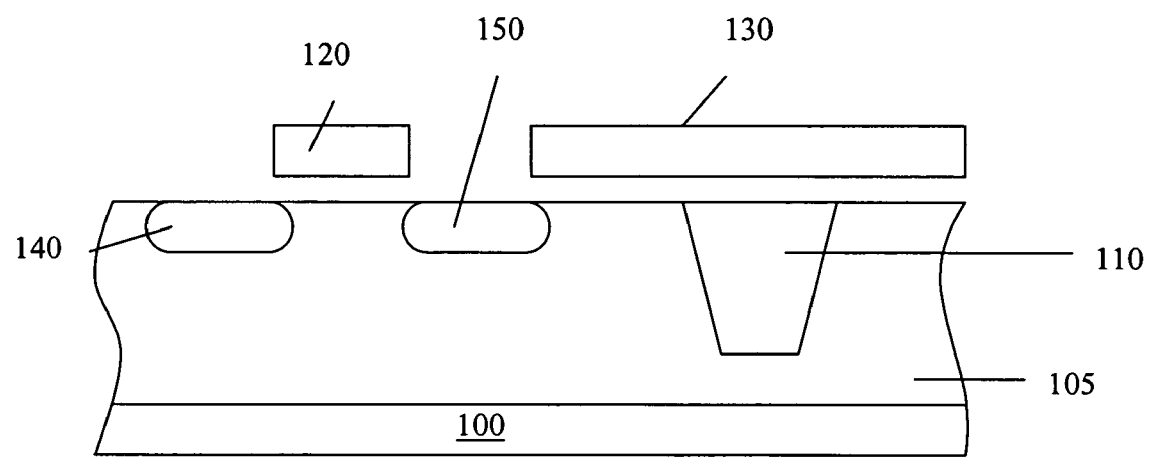
FIG. 1 illustrates a cross-sectional configuration of a DRAM cell or c1TRAM cell.

According to prior art FIG. 1, a single poly process requires a minimum, line width, spacing between the poly to poly structures of the transfer gate 225 and the capacitor plate 215, when formed by a single photomask of a single poly process. For a 0.13 μm, minimum line width, generation of semiconductor MOS structure, the minimum poly to poly distance is 0.18 μm or 1800 Angstroms. A poly to poly separation distance is reduced according to the present invention. The transfer gate 225 is formed by a photomask and photo etch process that does not form the capacitor plate 215. The capacitor plate 215 is formed by a photomask and photo etch that does not form the transfer gate 225. Thus, separate poly processes form the transfer gate 225 and capacitor plate 215, respectively, which aligns the structures 215 and 225 precisely apart, with a separation distance reduced to the order of hundreds of Angstroms, as determined by the thickness of the space 290. By comparison, a separation distance of 1800 Angstroms would be required when forming the poly to poly separation distance by a single photomask with a minimum line width requirement. Further, according to the invention, another process step is performed to fill the separation distance with the spacer material 290.

Figure 3A:
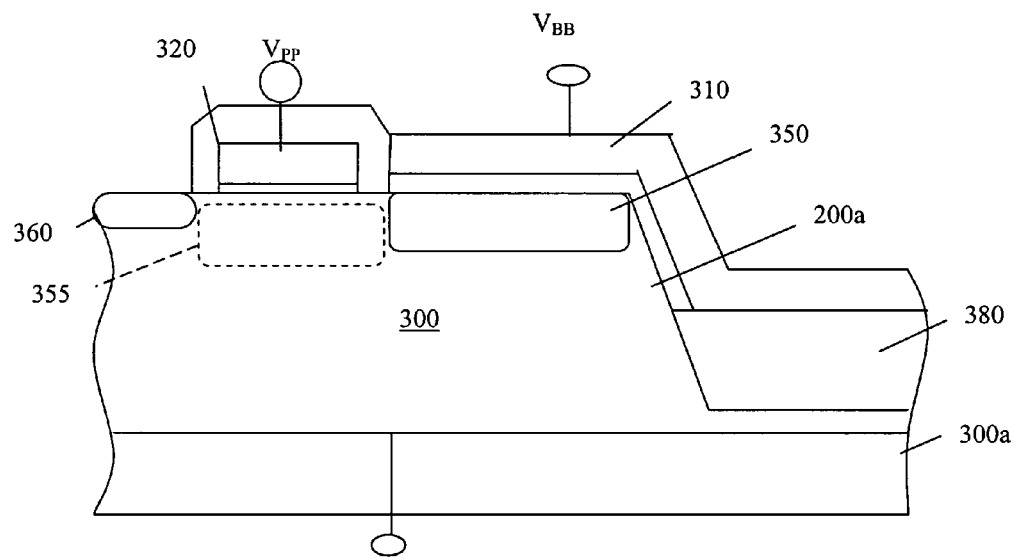
FIG. 3A is a cross sectional view of an embodiment of a 1TRAM cell having a capacitor with an inversion region made with a native device, and regarded as the storage node of the capacitor.
Figure 3B:
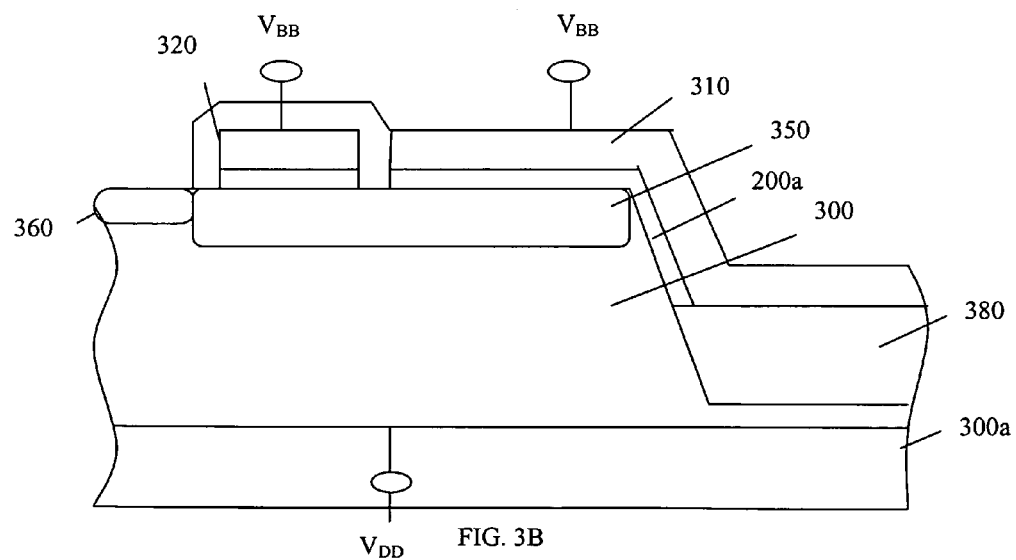
FIG. 3B is a cross sectional view of an embodiment of a 1TRAM cell having a capacitor and a transfer gate having a native device in an inversion region under the transfer gate.

Structural features shown in FIGS. 3A and 3B that are the same items in FIG. 2C are indicated by the same reference numerals that are increased by 100. They include the substrate 300, the electrode plate 310, the transfer gate 320, the S/D region 360 and the isolation material 380. In these embodiments shown in FIGS. 3A and 3B, the doped region 350 is a N-type well region. Further, the substrate 300 covers a base substrate, for example, a silicon wafer 300a.

FIG. 3A is a cross sectional view of an embodiment of a 1TRAM cell having a capacitor with storage node doped as a native device that forms an inversion region 350, and regarded as the storage node of the capacitor. For example, the doped region 350 is a N-type well region or a P well region, which may not need further ion implant after N-well formation, or P well formation, as would a P/N junction node.

When a bias voltage, $V_{BB}$, for example, −0.35 Volts, biases the top plate 310 of the capacitor, this generates an inversion layer within the substrate 300 and beneath the electrode plate 310. This inversion layer is regarded as the bottom plate of the capacitor or the storage node of the 1TRAM memory cell. The region beneath the electrode plate 310 will operate as an inversion region, whether data 0 (VSS) is stored or data 1 (VDD) is stored. Less holes are kept when data 0 is stored, and more holes will be kept when data 1 is stored. The minority carriers, for example, holes for a PMOS are sent out, or alternatively, in, while the transfer gate 320 turns on. The inversion layer diffuses into the transfer gate inversion region 355 beneath the gate 320 to increase the coupling efficiency between the transfer gate 320 and the capacitor. The edge of the capacitor with low Vt will turn on quicker than the region under transfer gate 320 that turns on the transistor by diffusion. Thus, the capacitor is assured to be turned on and in a data acquisition state when the transfer gate 320 turns on. Because the native device becomes an inversion layer without a junction storage node, the cell has superior immunity from subthreshold leakage.

In this embodiment, the charge transfer path will be cut off when the transfer gate 320 is biased at $V_{PP}$, from a supply voltage, which turns off the transistor controlled by the transfer gate 320. Since $V_{PP}$ is a positive voltage, the positive bias will repel positive charged minority carriers away from the edge of the transfer gate 320, so that the channel length of the transistor is effectively increased, which further decreases subthreshold current leakages of the transistor controlled by the transfer gate 320.

In the exemplary turn-off operation for the embodiment disclosed by FIG. 3A, $V_{BB}$ is equal or near to a transistor threshold voltage, such as Vtp for PMOS transistors and Vtn for NMOS transistors. In addition, $V_{PP}$ is higher than $V_{DD}$ by about a threshold voltage, for example, $V_{PP} \cong V_{DD}+|Vtp|$.

FIG. 3B is a cross sectional view of an embodiment of a 1TRAM cell having both a capacitor with a well storage node doped as a native device 350 that becomes an inversion layer of an inversion region, and a transfer gate with the well node 360 doped as a native device. The back bias voltage, $V_{BB}$ biases the plate 310 of the capacitor for the doped native device to become an inversion layer beneath the plate 310 at a low, near zero, threshold voltage, and without a junction storage node. The back bias voltage, $V_{BB}$ biases the transfer gate 320 for high speed operation, since the doped native device 350 under the transfer gate 320 has a low threshold voltage for becoming an inversion region under the transfer gate 320 without the high threshold voltage and leakage subthreshold current associated with a P/N junction.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A single transistor random access memory cell, comprising:
   a transfer gate over a substrate having a recess;
   a storage capacitor having a capacitor plate horizontally adjacent to the transfer gate; and
   a shallow trench isolation, STI, insulator within the recess of the substrate, the STI insulator having a height smaller than a depth of the recess of the substrate, wherein the
   a capacitor plate covers the STI insulator and conformally covers a sidewall of the recess of the substrate.

2. The cell as in claim 1, further comprising:
   an inversion region beneath the transfer gate, which is formed by diffusion of the inversion layer.

3. The cell as in claim 1, wherein
   the transfer gate and a capacitor plate being closer together than a minimum line width of a single photomask.

4. The cell as in claim 3, further comprising:
   a dielectric spacer between the transfer gate and the capacitor plate.

5. The cell as in claim 1, further comprising:
   an inversion region beneath the transfer gate, which is formed by diffusion of the inversion layer.

6. The cell as in claim 1, wherein
   the transfer gate and the capacitor plate are closer together than a minimum line width of a single photomask.

7. The cell as in claim 1, further comprising:
   a dielectric spacer between the transfer gate and the capacitor plate.

8. The cell as in claim 1, further comprising:
   an external MOS native device external to an active area of the substrate, the external MOS native device forming an invasion layer at near zero threshold voltage, wherein the transfer gate and the capacitor are in an active area of the substrate, and
   the capacitor plate covers the STI insulator and the external MOS native device.

9. The cell as in claim 8, further comprising:
   an inversion region beneath the transfer gate, which is formed by diffusion of the inversion layer.

10. The cell as in claim 8, further comprising:
    the transfer gate having an MOS native device forming an inversion region at a near zero threshold voltage.

11. The cell as in claim 8, wherein
    the transfer gate and the capacitor plate are closer together than a minimum line width of a single photomask.

12. The cell as in claim 11, further comprising:
    a dielectric spacer between the transfer gate and the capacitor plate.

13. The cell as in claim 1, wherein the capacitor has a storage node having an MOS native device with a near zero threshold voltage to form an invasion layer.

14. The cell as in claim 13, wherein
    the transfer gate has another MOS native device forming an inversion region at a near zero threshold voltage.

* * * * *

UNITED STATES PATENT AND TRADEMARK OFFICE
CERTIFICATE OF CORRECTION

PATENT NO.       : 7,247,901 B2
APPLICATION NO.  : 10/827389
DATED            : July 24, 2007
INVENTOR(S)      : Chung-Cheng Chou Page 1 of 1

It is certified that error appears in the above-identified patent and that said Letters Patent is hereby corrected as shown below:

Column 8, line 38, delete "invasion" and insert therefore -- inversion -- .

Column 8, line 57, delete "invasion" and insert therefore -- inversion -- .

Signed and Sealed this

Twenty-seventh Day of November, 2007

JON W. DUDAS
*Director of the United States Patent and Trademark Office*